United States Patent
Tanaka

(10) Patent No.: US 7,271,685 B2
(45) Date of Patent: Sep. 18, 2007

(54) SURFACE ACOUSTIC WAVE FILTER

(75) Inventor: Nobunari Tanaka, Hakusan (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 11/619,243

(22) Filed: Jan. 3, 2007

(65) Prior Publication Data

US 2007/0103259 A1 May 10, 2007

Related U.S. Application Data

(63) Continuation of application No. PCT/JP2005/011826, filed on Jun. 28, 2005.

(30) Foreign Application Priority Data

Jul. 15, 2004 (JP) ............... 2004-208293

(51) Int. Cl.
*H03H 9/64* (2006.01)
(52) U.S. Cl. ............... 333/193; 333/196; 310/313 C
(58) Field of Classification Search ........ 333/193–196; 310/313 B, 313 C, 313 D
See application file for complete search history.

(56) References Cited

U.S. PATENT DOCUMENTS 4,206,380 A * 6/1980 Hazama et al. ......... 310/313 B

FOREIGN PATENT DOCUMENTS

| JP | 55-080911 | A |   | 6/1980  |         |
|----|-----------|---|---|---------|---------|
| JP | 56-46333  | U |   | 4/1981  |         |
| JP | 59-034712 | A |   | 2/1984  |         |
| JP | 62-199110 |   | * | 9/1987  | 333/193 |
| JP | 2-44168   | B |   | 10/1990 |         |
| JP | 07-122962 | A |   | 5/1995  |         |
| JP | 07-162260 | A |   | 6/1995  |         |
| JP | 08-316773 | A |   | 11/1996 |         |
| JP | 2001-044791 | A |   | 2/2001  |         |

OTHER PUBLICATIONS

International Search Report for PCT Application No. PCT/JP2005/011826; mailed Oct. 25, 2005.

* cited by examiner

*Primary Examiner*—Barbara Summons
(74) *Attorney, Agent, or Firm*—Keating & Bennett, LLP

(57) ABSTRACT

A transversal surface acoustic wave filter includes an input-side interdigital electrode, an output-side interdigital electrode, and a shield electrode, which are provided on a surface wave substrate. The distance between an excitation point of the input-side interdigital electrode, which is closest to the shield electrode, and an intermediate point between the shield electrode-side end of the input-side interdigital electrode and the input-side interdigital electrode-side end of the shield electrode is in the range of about $0.8\lambda$ to about $0.975\lambda$, wherein $\lambda$ is the wavelength of a surface wave.

3 Claims, 3 Drawing Sheets

SURFACE ACOUSTIC WAVE FILTER

BACKGROUND OF THE INVENTION

1. Field of the Invention

The present invention relates to a transversal surface acoustic wave filter, and particularly, to a transversal surface acoustic wave filter including a shield electrode disposed between an input-side IDT electrode and an output-side IDT electrode.

2. Description of the Related Art

Transversal surface acoustic wave filters have been widely used as band-pass filters for video intermediate frequencies (VIF) of television receivers. In such a surface acoustic wave filter, a shield electrode is frequently disposed between an input-side IDT electrode and an output-side IDT electrode and connected to a ground potential. The shield electrode suppresses electromagnetic and electrostatic coupling between the input-side IDT electrode and the output-side IDT electrode.

In recent years, there has been strong demand for miniaturization of surface acoustic wave filters. In order to advance the miniaturization of a transversal surface acoustic wave filter, the distance between an input-side IDT electrode and an output-side IDT electrode must be decreased. However, a decrease in the distance causes a problem of producing an electric field between the shield electrode and the input-side IDT electrode, which causes an unwanted wave. In other words, the unwanted wave is coupled with a surface acoustic wave to be used on the output-side IDT electrode side, thereby causing a problem of producing a large ripple in the pass band.

Therefore, Patent Document 1 discloses a surface acoustic wave filter having a structure for suppressing the unwanted wave. FIG. 5 is a schematic plan view illustrating a surface acoustic wave filter disclosed in Japanese Examined Patent Application Publication No. 2-44168 (Patent Document 1).

A surface acoustic wave filter 101 includes a shield electrode 104 disposed between an input-side IDT electrode 102 and an output-side IDT electrode 103. Furthermore, two floating electrode fingers 105a and 105b with a line width of about λ/8 are disposed, with a space of about λ/8 therebetween, between the shield electrode 104 and the input-side IDT electrode 102. In addition, λ represents the wavelength of a surface wave used in the surface acoustic wave filter 101.

The excitation point of the unwanted wave is at an intermediate point between the input-side IDT electrode-side of the shield electrode 104 and the shield electrode-side end of the input-side IDT electrode 102. Therefore, when the floating electrode fingers 105a and 105b are arranged to sandwich the intermediate point therebetween, an excitation electric field of the unwanted wave is canceled.

In the surface acoustic wave filter 101 disclosed in Patent Document 1, a split-type floating electrode including the floating electrode fingers 105a and 105b is provided to cancel an excitation electric field of an unwanted wave, thereby suppressing a ripple caused by the unwanted wave. However, in the surface acoustic wave filter 101 disclosed in Patent Document 1, the unwanted wave produced when the input-side IDT electrode 102 is brought close to the shield electrode 104 can be suppressed, but a re-excited wave is produced by providing the split-type floating electrode, thereby causing a problem of producing a ripple due to the re-excited wave. More specifically, as described in Patent Document 1, when a split-type floating electrode including the floating electrode fingers 105a and 105b is provided, an undesired ripple inevitably occurs in the pass band.

SUMMARY OF THE INVENTION

To overcome the problems described above, preferred embodiments of the present invention provide a transversal surface acoustic wave filter in which even when miniaturization is advanced, an unwanted wave produced between a shield electrode and an IDT electrode is effectively suppressed, and a re-excited wave does not occur.

A transversal surface acoustic wave filter according to a preferred embodiment of the present invention includes a surface wave substrate, an input-side interdigital electrode and an output-side interdigital electrode spaced from the input-side interdigital electrode disposed on the surface wave substrate, and a shield electrode disposed between the input-side interdigital electrode and the output-side interdigital electrode and connected to a ground potential. These electrodes are disposed on the surface wave substrate, wherein the distance between an excitation point of the input-side interdigital electrode, which is closest to the shield electrode, and an intermediate point between the shield electrode-side end of the input-side interdigital electrode and the input-side interdigital electrode-side end of the shield electrode is in the range of about 0.8λ to about 0.975λ, where λ is the wavelength of a surface wave.

In a preferred embodiment of the present invention, in the surface acoustic wave filter, one of the input-side IDT electrode and the output-side IDT electrode is an unbalanced IDT electrode, and the other is a balanced IDT electrode.

In another preferred embodiment of the present invention, in the surface acoustic wave filter, one of the input-side IDT electrode and the output-side IDT electrode is weighted.

In a further preferred embodiment of the present invention, in the surface acoustic wave filter, the input-side IDT electrode and the output-side IDT electrode are normal IDT electrodes.

In the surface acoustic wave filter according to preferred embodiments of the present invention, the shield electrode is disposed between the input-side IDT electrode and the output-side IDT electrode and connected to the ground potential, and the distance X between an excitation point of the input-side IDT electrode, which is closest to the shield electrode, and an excitation point of an unwanted wave at an intermediate point between the shield electrode-side end of the input-side IDT electrode and the input-side IDT electrode-side end of the shield electrode is in the range of about 0.8λ to about 0.975λ, thereby effectively suppressing a ripple in the pass band. In other words, even when the distance between the input-side IDT electrode and the shield electrode is reduced, a ripple caused by an unwanted wave is effectively prevented, and an unnecessary re-excited wave does not occur because a split-type floating electrode is not provided. Therefore, even in an attempt to miniaturize the filter, the filter has good filter characteristics with minimal ripple, as compared to a conventional surface acoustic wave filter disclosed in Patent Document 1.

In preferred embodiments of the present invention, the possible reason why an unwanted wave is effectively suppressed by setting the distance X in the specified range is as follows. Although an unwanted wave should be strongly excited as the distance between the shield electrode and the input-side IDT electrode is deceased, it was found that a ripple appearing in filter characteristics is not increased as the distance between the shield electrode and the input-side IDT electrode is decreased. This is possibly due to the fact that an unwanted wave component is changed by an interaction between the phase conditions of an unwanted wave and a surface wave excited in an IDT electrode and is received by the output-side IDT electrode. More specifically, even when an unwanted wave is excited, a ripple in a signal received by the output-side IDT electrode is not necessarily increased by decreasing the distance, depending on the phase conditions of a surface wave to be used and an unwanted wave.

Furthermore, since a split-type floating electrode is not used, an undesirable re-excited wave does not occur. Therefore, preferred embodiments of the present invention provide a small surface acoustic wave filter having good filter characteristics and not producing an undesirable ripple even when the distance between an IDT electrode and a shield electrode is decreased for miniaturization.

According to preferred embodiments of the present invention, it is possible to provide a surface acoustic wave filter wherein when one of an input-side IDT electrode and an output-side IDT electrode is an unbalanced IDT electrode, and the other is a balanced IDT electrode, the surface acoustic wave filter has a balanced-unbalanced conversion function and has good filter characteristics.

According to preferred embodiments of the present invention, it is possible to provide a surface acoustic wave filter wherein when one of an input-side IDT electrode and an output-side IDT electrode is weighted, the surface acoustic wave filter has desired filter characteristics due to weighting and does not produce a ripple based on the unwanted wave and re-excited wave.

In a surface acoustic wave filter according to preferred embodiments of the present invention, an input-side IDT electrode and an output-side IDT electrode may be normal IDT electrodes. In this case, the present invention can easily provide a surface acoustic wave filter having good filter characteristics at low cost.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to the drawings.

Figure 1:
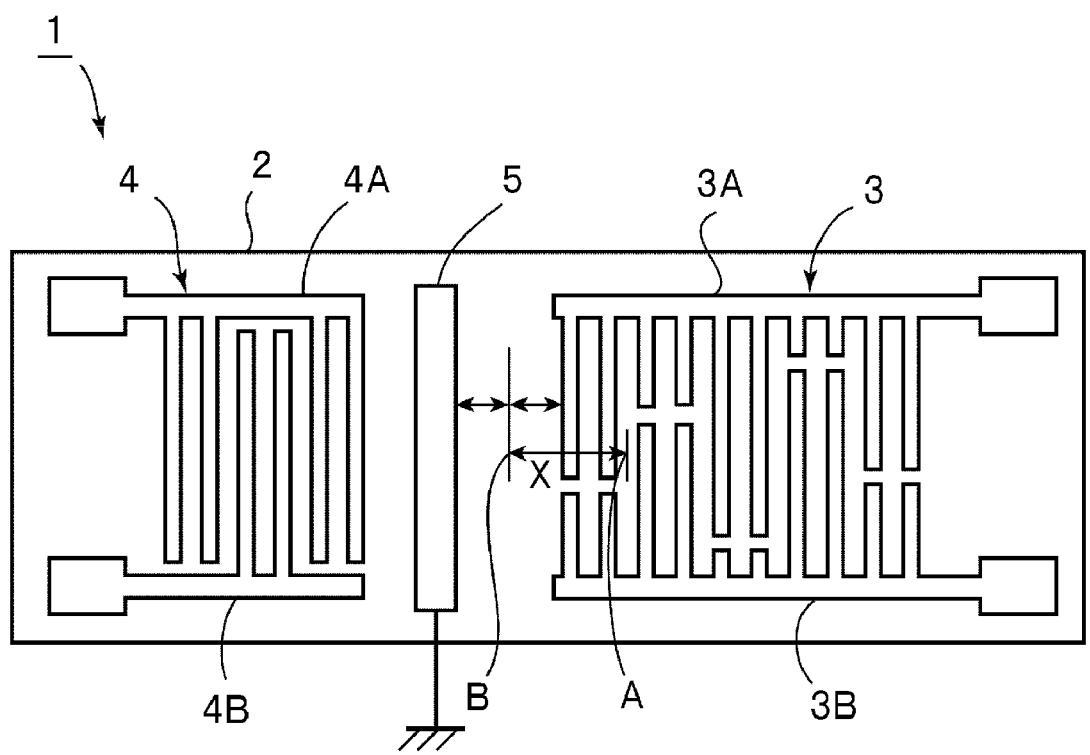
FIG. 1 is a plan view of a surface acoustic wave filter according to a preferred embodiment of the present invention.

FIG. 1 is a plan view of a surface acoustic wave filter according to a preferred embodiment of the present invention.

A surface acoustic wave filter 1 includes a surface wave substrate 2. The surface wave substrate 2 is preferably composed of a piezoelectric single crystal of $LiTaO_3$, $LiNbO_3$, or quartz, or a piezoelectric material such as piezoelectric ceramic, e.g., PZT ceramic. The surface wave substrate 2 may have a structure in which a piezoelectric thin film is disposed on an insulating substrate composed of glass or other suitable material.

In addition, an input-side IDT electrode 3 and an output-side IDT electrode 4 are disposed with a space therebetween in the propagation direction of a surface wave on the surface wave substrate 2. The input-side IDT electrode 3 is an IDT electrode that is weighted by a cross width weighting, and, in this preferred embodiment, it is an unbalanced IDT electrode.

The input-side IDT electrode 3 includes a comb electrode 3A including a plurality of electrode fingers and a comb electrode 3B including a plurality of electrode fingers.

In this preferred embodiment, the plurality of electrode fingers of the comb electrodes 3A and 3B include split-type electrodes. A split-type electrode is an electrode including a pair of electrode fingers connected to the same potential.

In the present invention, of course, the electrode fingers of the IDT electrodes are not limited to split-type electrodes.

The output-side IDT electrode 4 is an IDT electrode that is capable of taking out balanced output. The output-side IDT electrode 4 includes a pair of comb electrodes 4A and 4B. Like in the input-side IDT electrode, electrode fingers of the comb electrode 4A include split-type electrodes. The electrode fingers of the output-side IDT electrode 4 are not limited to split-type electrodes.

Furthermore, a shield electrode 5 is disposed between the input-side IDT electrode 3 and the output-side IDT electrode 4 on the surface wave substrate 2. The shield electrode 5 is connected to a ground potential.

The input-side IDT electrode 3, the output-side IDT electrode 4, and the shield electrode 5 are composed of an appropriate conductive material, such as, for example, Al or an Al alloy.

In the surface acoustic wave filter 1 according to this preferred embodiment, the distance X between an excitation point A of the input-side IDT electrode 3, which is closest to the shield electrode 5, and an intermediate point B between the shield electrode-side end of the input-side IDT electrode 3 and the end of the shield electrode 5, which is close to the input-side IDT electrode 3, is in the range of about $0.8\lambda$ to about $0.975\lambda$. $\lambda$ is the wavelength of a surface wave used in the surface acoustic wave filter 1.

Excitation points of the input-side IDT electrode are positioned at centers between the adjacent electrode fingers connected to different potentials. The input-side IDT electrode 3 has a plurality of excitation points, and among the plurality of excitation points, the excitation point A is closest to the shield electrode.

As described above, in this type of transversal surface acoustic wave filter 1, the distance between the input-side IDT electrode 3 and the shield electrode 5 must be decreased for miniaturization. However, when the distance between the input-side IDT electrode 3 and the shield electrode 5 is decreased, an unwanted wave is excited, thereby producing a large ripple in the pass band. In the surface acoustic wave filter 101 disclosed in Patent Document 1, the above-described floating electrode fingers 105a and 105b are arranged to suppress the unwanted wave. However, a structure using the floating electrode fingers 105*a* and 105*b* has a problem of producing a re-excited wave, which produces a ripple.

On the other hand, the surface acoustic wave filter 1 according to this preferred embodiment includes no floating electrode finger, and thus, does not produces the re-excited wave, and thereby does not produce a ripple due to the re-excited wave. In addition, only by setting the distance X in the range of about $0.8\lambda$ to about $0.975\lambda$, a ripple due to an unwanted wave produced by arranging the input-side IDT electrode 3 close to the shield electrode 5 is effectively suppressed. This was experimentally confirmed by the inventor of the present invention. With reference to an experimental example, it will be described below that a ripple in the pass band is effectively suppressed when the distance X is in the range of about $0.8\lambda$ to about $0.975\lambda$.

The input-side IDT electrode 3, the output-side IDT electrode 4, and the shield electrode 5 were disposed on the surface wave substrate 2 made of glass using Al as an electrode material. Furthermore, a ZnO piezoelectric thin film having a thickness of about 25 μm, for example, was disposed on these electrodes. The wavelength λ was about 59.48 μm, and the distance between the input-side IDT electrode 3 and the output-side IDT electrode 4 was about 400 μm. The number of the electrode finger pairs of the input-side IDT electrode 3 was 151, and the number of the electrode finger pairs of the output-side IDT electrode 4 was 9. In this manner, a surface acoustic wave filter used as a VIF band-pass filter for digital televisions with a center frequency of about 44 MHz was prepared.

Figure 2:
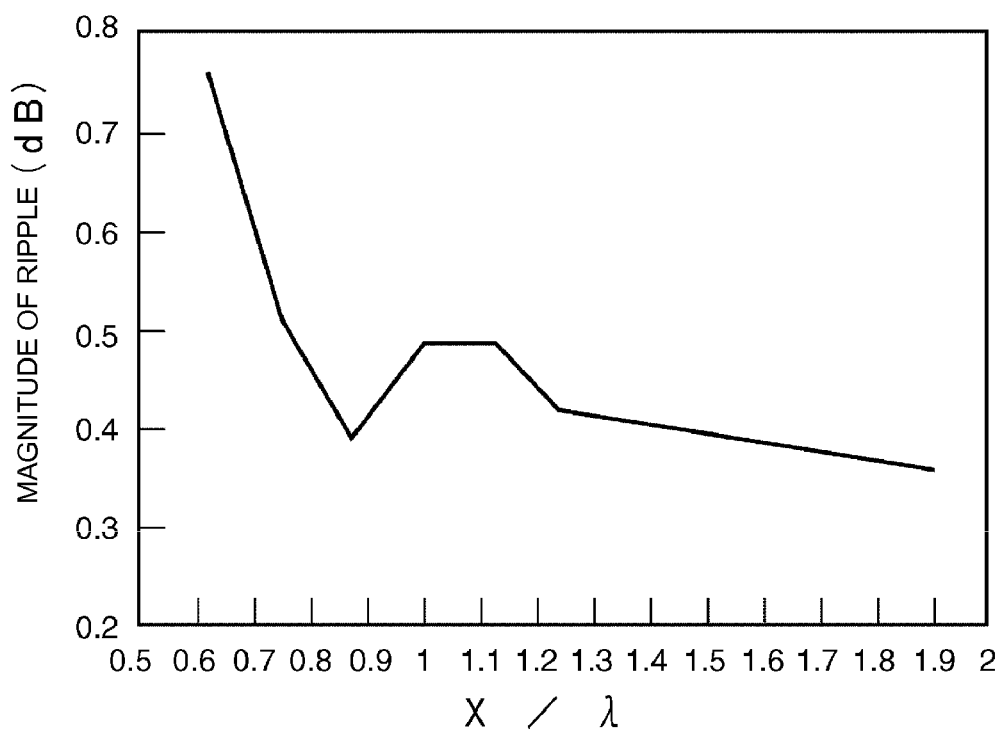
FIG. 2 is a graph showing changes in magnitude of a ripple with changes in the distance X/λ in the surface acoustic wave filter shown in FIG. 1.

The distance X in the surface acoustic wave filter 1 was changed to about $1.91\lambda$, about $1.25\lambda$, about $1.125\lambda$, about $1.0\lambda$, about $0.875\lambda$, about $0.75\lambda$, and about $0.625\lambda$ to produce a plurality of surface acoustic wave filters 1. The frequency characteristics of the thus-produced surface acoustic wave filters 1 were measured to observe whether or not a ripple occurred in the pass band. The results are shown in FIG. 2. In FIG. 2, a X/λ value obtained by normalizing the distance X with respect to wavelength λ is shown as the abscissa, and the magnitude of a ripple is shown as the ordinate. The magnitude of a ripple refers to the maximum difference between the adjacent maximum and minimum values of a ripple in the pass band.

As seen from FIG. 2, the magnitude of a ripple with the distance X of about $0.625\lambda$ is greater than that of a ripple with the distance X of about $0.91\lambda$. More specifically, it is found that when the distance X is decreased for miniaturization, the magnitude of a ripple in the pass band tends to increase. However, it is also found that the magnitude of a ripple is not necessarily increased as the distance X is decreased.

In other words, even when the distance X is decreased from about $1.125\lambda$ to about $1.0\lambda$, the magnitude of a ripple is not changed, and when the distance X is decreased from about $1.0\lambda$ to about $0.875\lambda$, the magnitude of a ripple is conversely decreased in spite of the short distance X. When X is about $0.875\lambda$, a ripple is minimized, and when X is smaller than about $0.875\lambda$, a ripple is again increased.

It has been thought that as the distance between the input-side IDT electrode and the shield electrode is decreased, an unwanted wave is strongly excited to increase a ripple due to the unwanted wave. However, it is found from the results shown in FIG. 2 that, in fact, a ripple due to an unwanted wave is not necessarily increased as the distance between the input-side IDT electrode 3 and the shield electrode 5 is decreased. This is possibly due to the fact that although an unwanted wave is strongly excited when the input-side IDT electrode 3 is brought close to the shield electrode 5, in receiving by the output-side IDT electrode 4, the influence of an unwanted wave component changes depending on an interaction between the unwanted wave and a surface wave to be utilized.

On the basis of the results shown in FIG. 2, the inventor of the present invention measured the magnitude of a ripple with various X values near $X=0.875\lambda$ where a ripple is minimized. The results are shown in FIG. 3.

Figure 3:
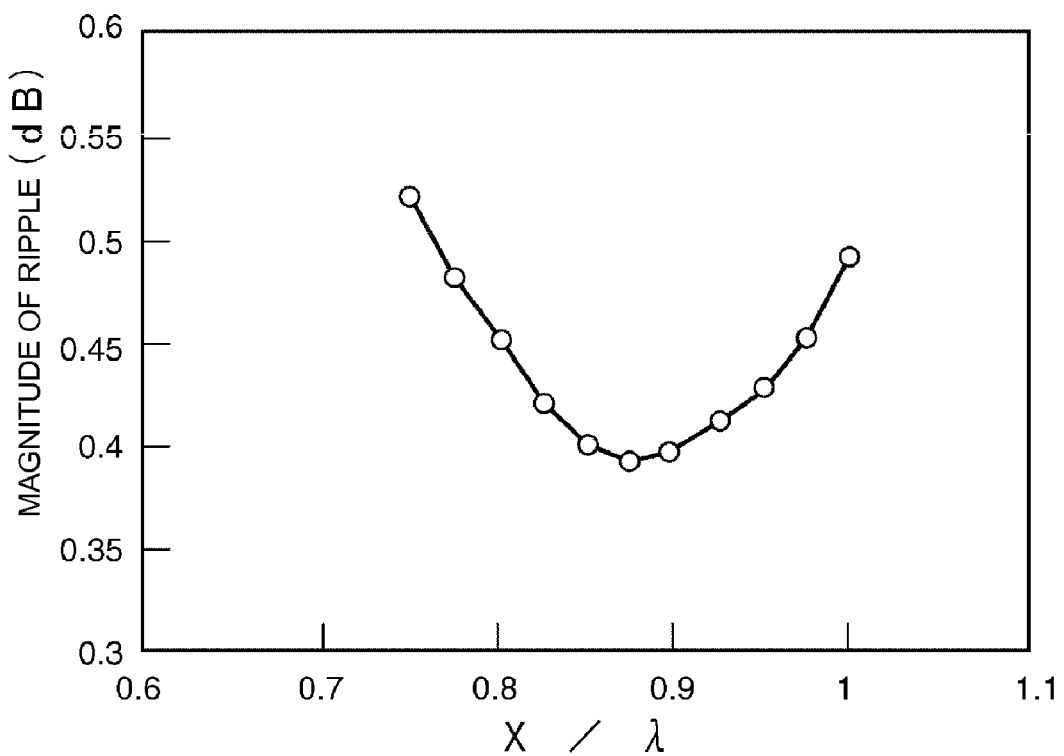
FIG. 3 is a graph showing changes in magnitude of a ripple with changes in the distance X/λ near 0.875 in the surface acoustic wave filter shown in FIG. 1.

FIG. 3 indicates that in the range of $X=0.8\lambda$ to $0.975\lambda$, the magnitude of a ripple can be decreased to about 0.45 dB or less. In a video intermediate frequency band-pass filter for digital televisions, picture quality is degraded by a large ripple in the pass band, but in this case, the magnitude of a ripple is preferably about 0.45 dB or less. Therefore, when X is in the range of about $0.8\lambda$ to about $0.975\lambda$, this requirement is satisfied.

X is more preferably about $0.85\lambda$ to about $0.9\lambda$. In this case, the magnitude of a ripple is decreased to about 0.4 dB or less, and the same characteristic as a large-sized surface acoustic wave filter with X of about $1.5\lambda$ or more is obtained.

Next, with respect to the frequency characteristics of the surface acoustic wave filter 1 according to this preferred embodiment, it will be described with reference to FIG. 4 that a ripple is effectively decreased as compared to a conventional surface acoustic wave filter.

Figure 4:
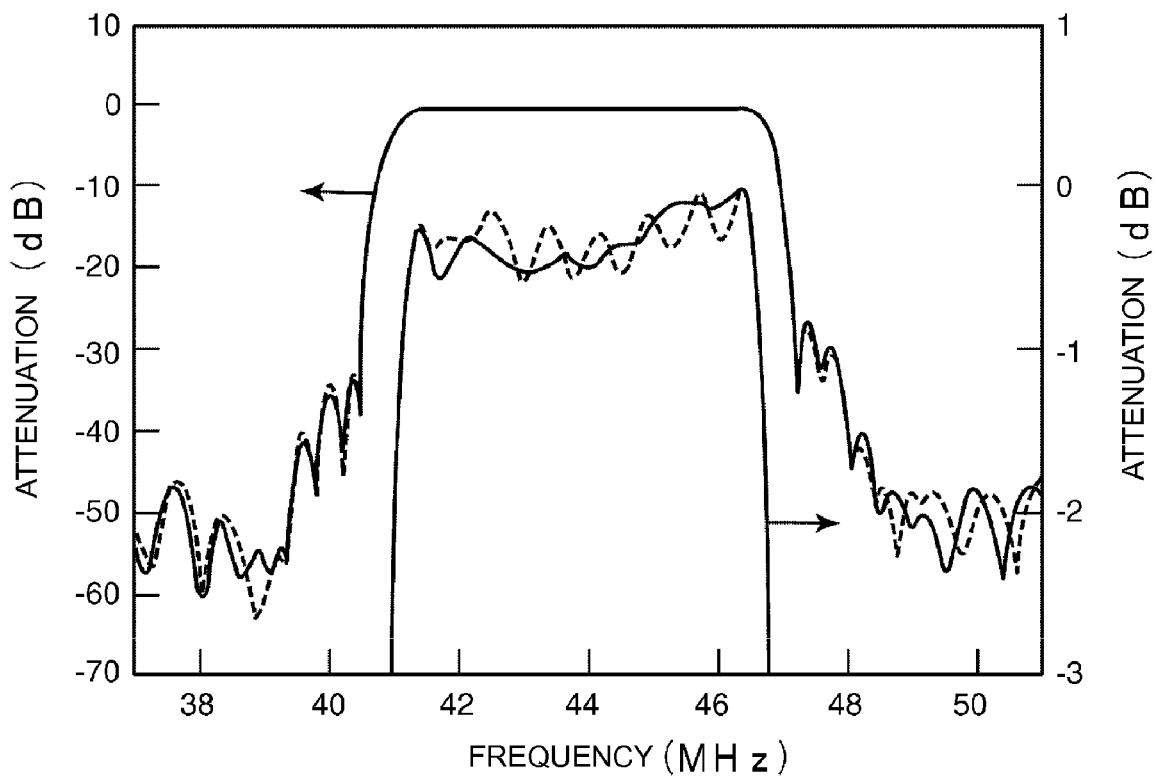
FIG. 4 is a graph showing the frequency characteristics of a surface acoustic wave filter according to a preferred embodiment of the present invention and a conventional surface acoustic wave filter prepared for comparison.
Figure 5:
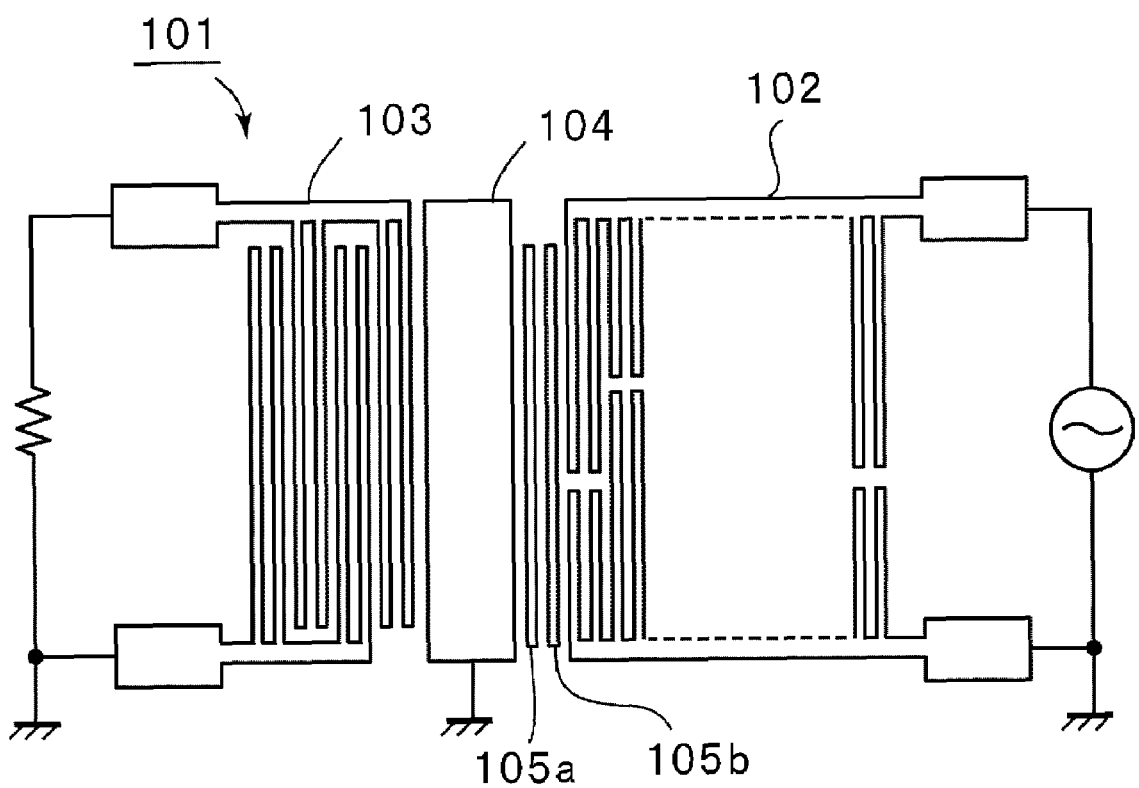
FIG. 5 is a plan view showing an example of conventional surface acoustic wave filters.

In FIG. 4, a solid line shows the filter characteristics of the surface acoustic wave filter 1 of this preferred embodiment with $X=0.875\lambda$. A broken line shows the frequency characteristics of a conventional surface acoustic wave filter for comparison. The surface acoustic wave filter having the characteristics shown by a broken line corresponds to a surface acoustic wave filter including the floating electrode fingers 105*a* and 105*b* according to Patent Document 1. In this case, $X=0.75\lambda$. More specifically, in the surface acoustic wave filter 101 shown in FIG. 5, the distance X between an excitation point of the input-side IDT electrode 102, which is closest to the shield electrode, and the excitation point of an unwanted wave is about $0.75\lambda$.

FIG. 4 shows that in a conventional surface acoustic wave filter, a large ripple periodically appears in the pass band, while in the surface acoustic wave filter of the preferred embodiment, such a ripple does not appear.

Although, in this preferred embodiment, the input-side IDT electrode 3 is an unbalanced IDT electrode, and the output-side IDT electrode is a balanced IDT electrode, the surface acoustic wave filter may be a reversed balanced input-unbalanced output type.

Although, in the surface acoustic wave filter 1 shown in FIG. 1, the input-side IDT electrode 3 is weighted by the cross width weighting, and the output-side IDT electrode 4 is a normal IDT electrode, the output-side IDT electrode 4 may be weighted by the cross width weighting, and the input-side IDT electrode 3 may be a normal IDT electrode.

With respect to weighting of the IDT electrode, weighting is not limited to the above-described cross width weighting, and another weighting method, such as withdrawal weighting, may be used.

In the surface acoustic wave filter according to preferred embodiments of the present invention, both the input-side IDT electrode and the output-side IDT electrode may be normal IDT electrode.

In other words, since the phase of a surface wave depends on the position of an excitation point, an unwanted wave can be effectively suppressed by setting the distance X in the specified range described above according to the present invention regardless of whether or not an IDT electrode is weighted.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A transversal surface acoustic wave filter comprising:
    a surface acoustic wave substrate;
    an input-side interdigital electrode disposed on the surface acoustic wave substrate;
    an output-side interdigital electrode disposed on the surface acoustic wave substrate so as to be spaced from the input-side interdigital electrode; and
    a shield electrode disposed on the surface acoustic wave substrate between the input-side interdigital electrode and the output-side interdigital electrode and connected to a ground potential; wherein
    a distance between an excitation point of the input-side interdigital electrode, which is closest to the shield electrode, and an intermediate point between the shield electrode-side end of the input-side interdigital electrode and the input-side interdigital electrode-side end of the shield electrode is in the range of about $0.8\lambda$ to about $0.975\lambda$, where $\lambda$ is a wavelength of a surface wave; and
    one of the input-side IDT electrode and the output-side IDT electrode is an unbalanced IDT electrode, and the other of the input-side IDT electrode and the output-side IDT electrode is a balanced IDT electrode.

2. The surface acoustic wave filter according to claim 1, wherein one of the input-side IDT electrode and the output-side IDT electrode is weighted.

3. The surface acoustic wave filter according to claim 1, wherein the input-side IDT electrode and the output-side IDT electrode are normal IDT electrodes.

* * * * *